(12) United States Patent
Kwon et al.

(10) Patent No.: US 12,217,977 B2
(45) Date of Patent: Feb. 4, 2025

(54) METHOD AND APPARATUS FOR TREATING SUBSTRATE

(71) Applicant: SEMES CO., LTD., Cheonan-si (KR)

(72) Inventors: Oh Yeol Kwon, Cheonan-si (KR); Soo Young Park, Incheon (KR); Soo Yeon Shin, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/665,233

(22) Filed: Feb. 4, 2022

(65) Prior Publication Data

US 2022/0310415 A1    Sep. 29, 2022

(30) Foreign Application Priority Data

Mar. 24, 2021    (KR) .................. 10-2021-0037865

(51) Int. Cl.
| | |
|---|---|
| H01L 21/67 | (2006.01) |
| B08B 3/02 | (2006.01) |
| B08B 13/00 | (2006.01) |
| G05D 3/20 | (2006.01) |
| G06T 7/00 | (2017.01) |
| G06T 7/70 | (2017.01) |

(52) U.S. Cl.
CPC .......... *H01L 21/67051* (2013.01); *B08B 3/02* (2013.01); *B08B 13/00* (2013.01); *G05D 3/20* (2013.01); *G06T 7/001* (2013.01); *G06T 7/70* (2017.01); *H01L 21/67259* (2013.01)

(58) Field of Classification Search
CPC ......... H01L 21/67051; H01L 21/67259; H01L 21/67288; H01L 21/67253; H01L 21/67276; H01L 21/6708; B08B 3/02; B08B 13/00; B08B 3/024; G05D 3/20; G06T 7/001; G06T 7/70
USPC ......................................... 382/103; 414/935
See application file for complete search history.

(56) References Cited

U.S. PATENT DOCUMENTS

| | | | |
|---|---|---|---|
| 8,057,153 B2 | 11/2011 | Hiroki | |
| 2004/0023439 A1* | 2/2004 | Kimino | ............... H01L 21/6715 438/126 |

(Continued)

FOREIGN PATENT DOCUMENTS

| | | |
|---|---|---|
| JP | 2011-077245 | 4/2011 |
| JP | 2016-070693 | 5/2016 |

(Continued)

OTHER PUBLICATIONS

KR 20120051575 A Written Description (Year: 2017).*

(Continued)

*Primary Examiner* — Mikhail Kornakov
*Assistant Examiner* — Emily H Yaharpour

(57) ABSTRACT

A substrate treating method includes moving a first component of a substrate treatment device to a preset position in response to a treating process of the substrate treatment device, detecting, by a plurality of position detection sensors, a position of the first component, vision-testing, by a vision sensor, a positional state of the first component, and determining an operational state of an error in the detection of the plurality of position detection sensors or a malfunction of the substrate treatment device based on a detection result obtained by the plurality of position detection sensor and a test result obtained by the vision sensor.

8 Claims, 10 Drawing Sheets

(56) References Cited

U.S. PATENT DOCUMENTS

2016/0091892 A1* 3/2016 Okita .................. B25J 9/1674
700/121
2016/0231528 A1* 8/2016 Wong ..................... G03B 5/00

FOREIGN PATENT DOCUMENTS

| JP | 2020-004817 | | 1/2020 |
|----|----|----|----|
| KR | 1020150139018 | | 12/2015 |
| KR | 10-2016-0037065 | | 4/2016 |
| KR | 20120051575 A | * | 1/2017 |
| KR | 20160037088 A | * | 2/2017 |
| KR | 1020180002101 | | 1/2018 |
| WO | 2008-029608 | | 3/2008 |

OTHER PUBLICATIONS

KR 20160037088 A Written Description (Year: 2017).*
Office Action from the Japan Patent Office dated Mar. 7, 2023.
Office Action from the Korean Intellectual Property Office dated Apr. 25, 2023.
Office action from Taiwan Intellectual Property Office dated Jun. 10, 2022.

* cited by examiner

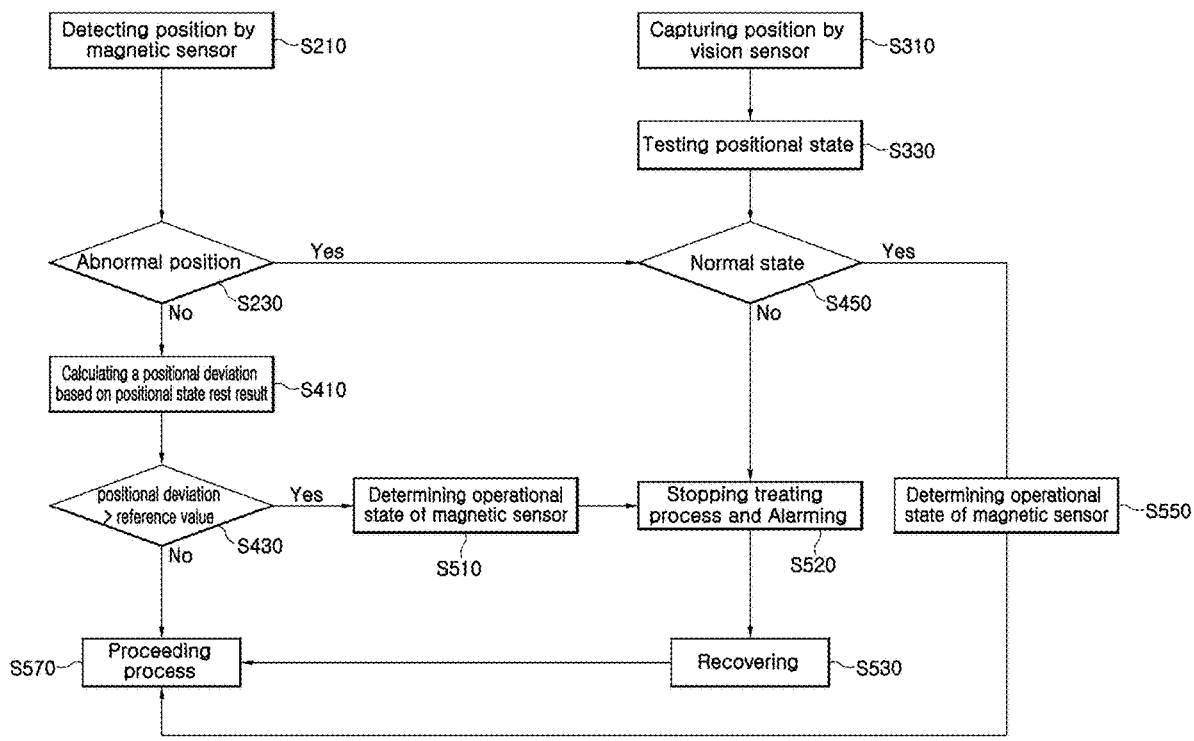

(a)

(b)

METHOD AND APPARATUS FOR TREATING SUBSTRATE

CROSS REFERENCE TO RELATED APPLICATION

The present application claims priority to Korean Patent Application No. 10-2021-0037865, filed Mar. 24, 2021, the entire contents of which is incorporated herein for all purposes by this reference.

BACKGROUND OF THE INVENTION

Field of the Invention

The present disclosure relates generally to a method and an apparatus of treating a substrate and, more particularly, to a means configured to detect a moved position of a treating container or a spray nozzle of a substrate treatment device by a plurality of position detection sensors and to perform vision-testing to determine a detection error of the plurality of position detection sensors and a malfunction of the substrate treatment device and to take a follow-up action in response to a determination result.

Description of the Related Art

In order to manufacture a semiconductor device or a liquid crystal display, various processes such as photolithography, asking, ion implantation, thin film deposition, and cleaning are performed on a substrate. The cleaning process is performed to remove particles remaining on the substrate, and is performed before and after each process.

The cleaning process is performed to remove particles on the substrate by supplying chemicals and organic solvents on the substrate through a substrate treatment device. A treating process includes a process of loading and unloading the substrate and a process of supplying different treating liquids and recovering a treating liquid related to the treating process. In the treating process, a process of moving the treating container in vertical directions to a preset position or rotatably moving a spray nozzle to a waiting position and a process position. Whether the treating container is appropriately moved in the vertical directions to the preset height position and whether the spray nozzle is appropriately rotated to the process position are very important factors in carrying out the process.

Generally, elevation units vertically moving the treating container to the preset height position or a nozzle moving driver rotatably moving the spray nozzle to the waiting position and the process position are provided in the substrate treatment device. A height position of the treating container moved by the elevation units or a rotary position of the spray nozzle performed by the nozzle moving driver are detected by a position detection sensor based on a magnet sensor, and whether movement of each component is appropriately performed is also determined.

However, when each part is not appropriately moved to a position for carrying out the treating process, the treating process is stopped with an alarm and recovery operation starts, and most of alarm occurrences are caused by an error in the detection of the position detection sensors. The detection error occurrences unnecessarily stop the treating process and cause a recovery operation, and the overall process yield is reduced.

When the position detection sensor detects a normal position even though the part has not been properly moved to the position for performing the treating process, serious problems such as defective products or equipment damage by performing the treating process are caused.

Therefore, it is necessary to take measures to prevent errors in detection of the position detection sensor.

Documents of Related Art (Patent Document 1) Korean Patent Application Publication No. 10-2015-0139018;
(Patent Document 2) Korean Patent Application Publication No. 10-2018-0002101.

SUMMARY OF THE INVENTION

Accordingly, the present disclosure has been made keeping in mind the above problems occurring in the related art, and the present disclosure is intended to propose a means configured to precisely determine whether a treating container or a spray nozzle is moved to an appropriate position suitable for a related treating process.

Another objective of the present disclosure is intended to a means configured to solve a problem in that a treating process is unnecessarily stopped and a recovery operation is performed in response to an error in the detection of a position detection sensor detecting a position of a treating container or a spray nozzle and a yield of the process is entirely reduced.

A further objective of the present disclosure is intended to a means configured to solve a serious problem such as defective products or equipment damage caused by performing the treating process when a position detection sensor detects a normal position to generate even through a treating container or a spray nozzle is not moved to an appropriate position.

The present disclosure are not limited to the above-described objectives, and other objectives and advantages of the present disclosure not mentioned will be clearly understood by those skilled in the art from the subsequent description.

According to an embodiment of the present invention, a substrate treating method may include: moving a first component of a substrate treatment device to a preset position in response to a treating process of the substrate treatment device; detecting, by a plurality of position detection sensors, a position of the first component; vision-testing, by a vision sensor, a positional state of the first component; and determining an operational state of an error in the detection of the plurality of position detection sensors or a malfunction of the substrate treatment device based on a detection result obtained by the plurality of position detection sensor and a test result obtained by the vision sensor.

According to an embodiment of the present invention, a substrate treatment device may include: a substrate support unit configured to support a substrate; a treating container having a process space with an open upper portion so as to accommodate the substrate support unit in the process space, the treating container having a recovery container configured to introduce and suction treating fluid of a treating process; elevation units configured to move the treating container in vertical directions and to change a relative height of the treating container to the substrate support unit; a treating container position detection sensor configured to detect a height position of the treating container in response to vertical movements of the treating container; a vision sensor configured to capture a position of the treating container from an upper side of the treating container; and an operation determination part configured to test a positional state of the treating container on the basis of an image captured by the vision sensor, and to compare a result of the positional state test to a detection result of the treating container position detection sensor, and to determine an operational state of a detection error of the treating container position detection sensor or a malfunction of the substrate treatment device.

According to an embodiment of the present invention, a substrate treating method may include: moving a treating container to a preset position in response to a treating process of a substrate treatment device; detecting, by a plurality of magnet detectors arranged at a plurality of height positions of the treating container, respectively, a plurality of magnets provided at a plurality of elevation units, respectively, located at opposite sides of the treating container; vision-testing a positional state of the treating container by comparing an image captured from an upper side of the treating container to pre-stored normal state information for the preset position of the treating container; determining an operational state, when a result of the detection by the position detection sensor is determined as an abnormal position, determining an operational state of a detection error of the position detection sensor or a malfunction of the substrate treatment device on the basis of a result of the positional state test by the vision sensor and when the result of the detection by the position detection sensor is determined as a normal position, determining an operational state in response to the detection tolerance of the position detection sensor on the basis of the result of positional state test by the vision sensor; and taking a follow-up action according to the result of the operational state determination. When the operational state is determined as the detection error of the position detection sensor, the treating process is continuously performed. When the operational state is determined as a malfunction of the substrate treatment device or it is determined that the detection tolerance of the position detection sensors exceeds the reference value, the treating process is stopped and alarm information is provided.

According to the present disclosure, the positional state of the treating container or the spray nozzle is detected by being detected by the plurality of position detection sensors detects and additionally tested by the vision sensor. Therefore, an error in the detection of the plurality of position detection sensors can be determined and the treating process of the substrate treatment device can be prevented from being unnecessary stopped to improve a process yield of the treating process.

When the plurality of position detection sensors detects a position of the treating container or the spray nozzle as the normal position even though the treating container or the spray nozzle failed to move to the normal position, the position thereof can be determined as the abnormal position by the vision sensor, and serious problems such as defective products or equipment damage caused by performing the treating process can be prevented in advance.

The effect of the present disclosure is not limited to the above description, and other effects not mentioned will be clearly understood by those skilled in the art from the subsequent description.

BRIEF DESCRIPTION OF THE DRAWINGS

The above and other objectives, features, and other advantages of the present disclosure will be more clearly understood from the subsequent detailed description when taken in conjunction with the accompanying drawings, in which:

FIG. 5 is a flowchart showing from a position detection process to a follow-up action process of the substrate treating method according to an embodiment of the present disclosure;

DETAILED DESCRIPTION OF THE INVENTION

Hereinbelow, exemplary embodiments of the present disclosure will be described in detail with reference to accompanying drawings, and the present disclosure is not limited to the embodiments.

In order to describe the present disclosure, operational advantages of the present disclosure, and objectives achieved by the embodiments of the present disclosure, the exemplary embodiments of the present disclosure will be described as examples below.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

In the following description, it is to be noted that, when the functions of conventional elements and the detailed description of elements related with the present disclosure may make the gist of the present disclosure unclear, a detailed description of those elements will be omitted.

The present disclosure discloses a means configured to detect a moved position of a treating container or a spray nozzle of a substrate treatment device by a position detection sensor and to perform vision-testing to determine an error in the detection of the position detection sensor and a malfunction of the substrate treatment device and to take a follow-up action in response to a determination result.

Figure 1:
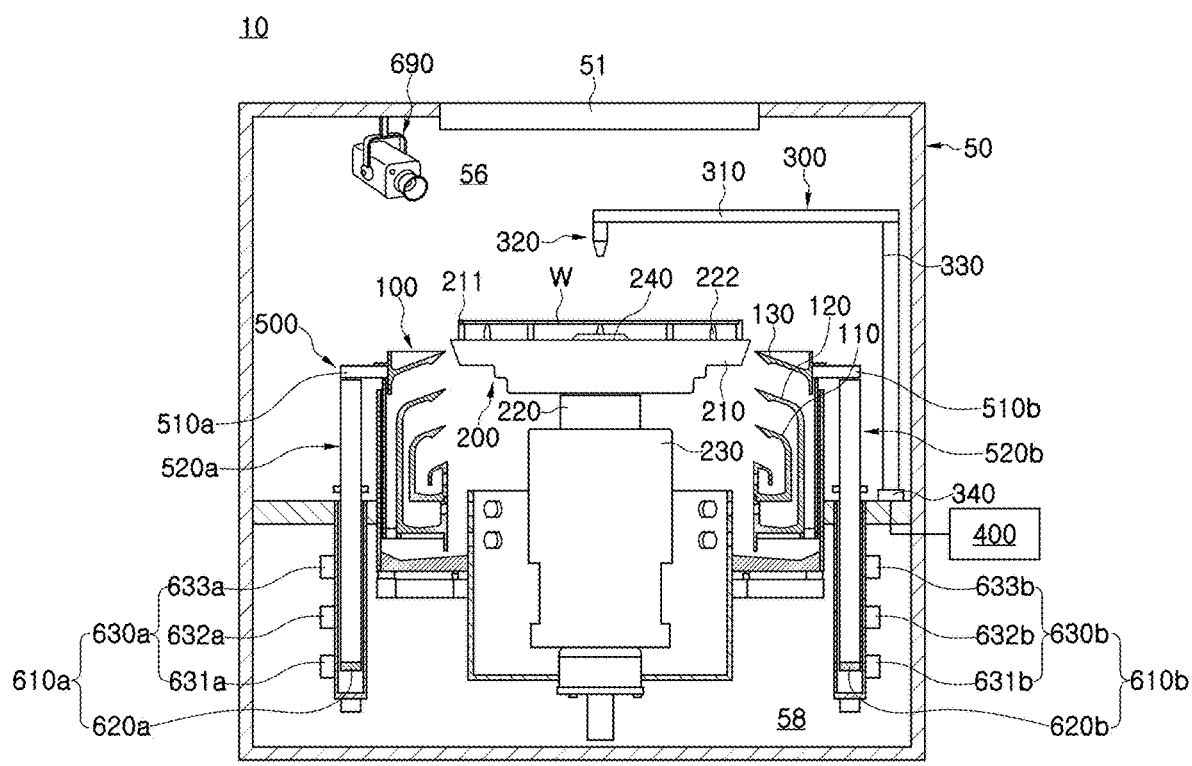
FIG. 1 is a view showing a substrate treatment device according to an embodiment of the present disclosure.
Figure 2:
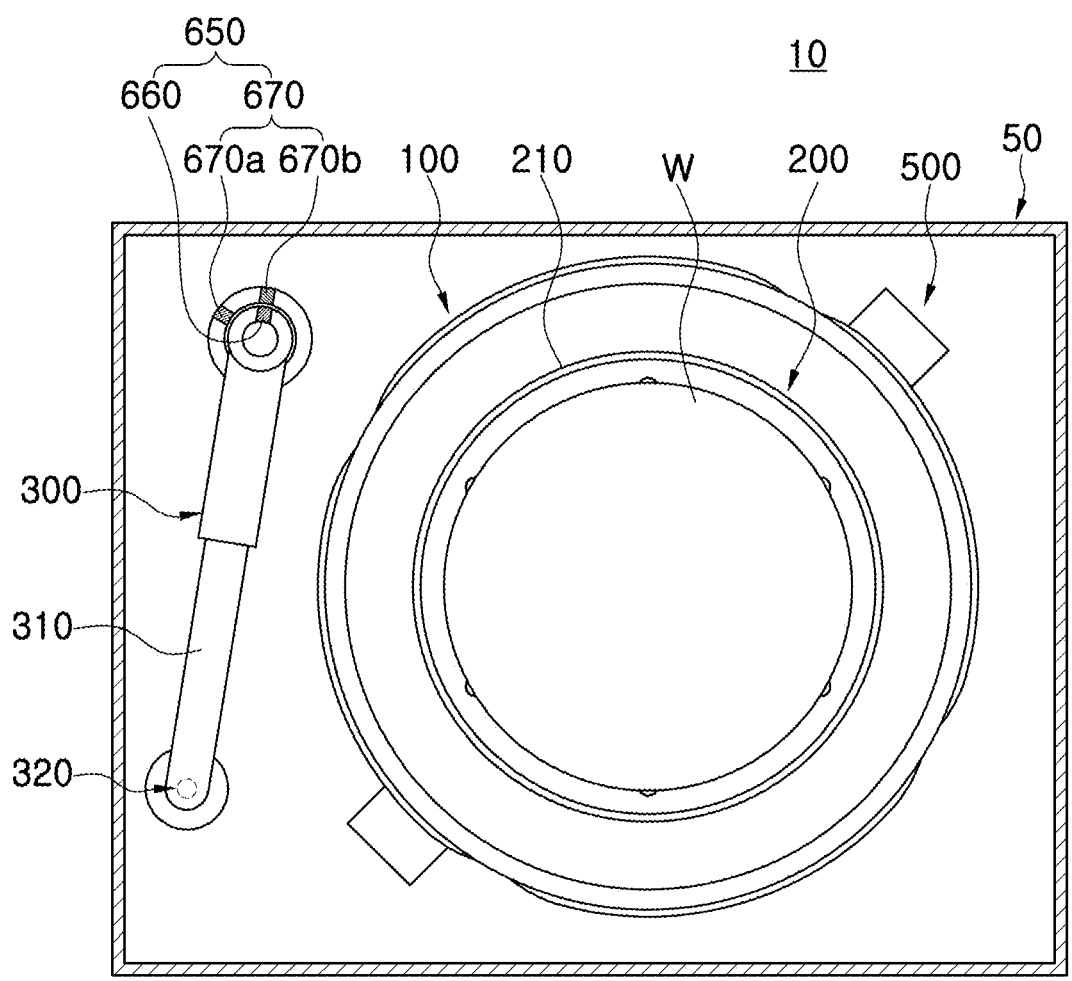
FIG. 2 is a top view showing the substrate treatment device according to an embodiment of the present disclosure.
Figure 3:
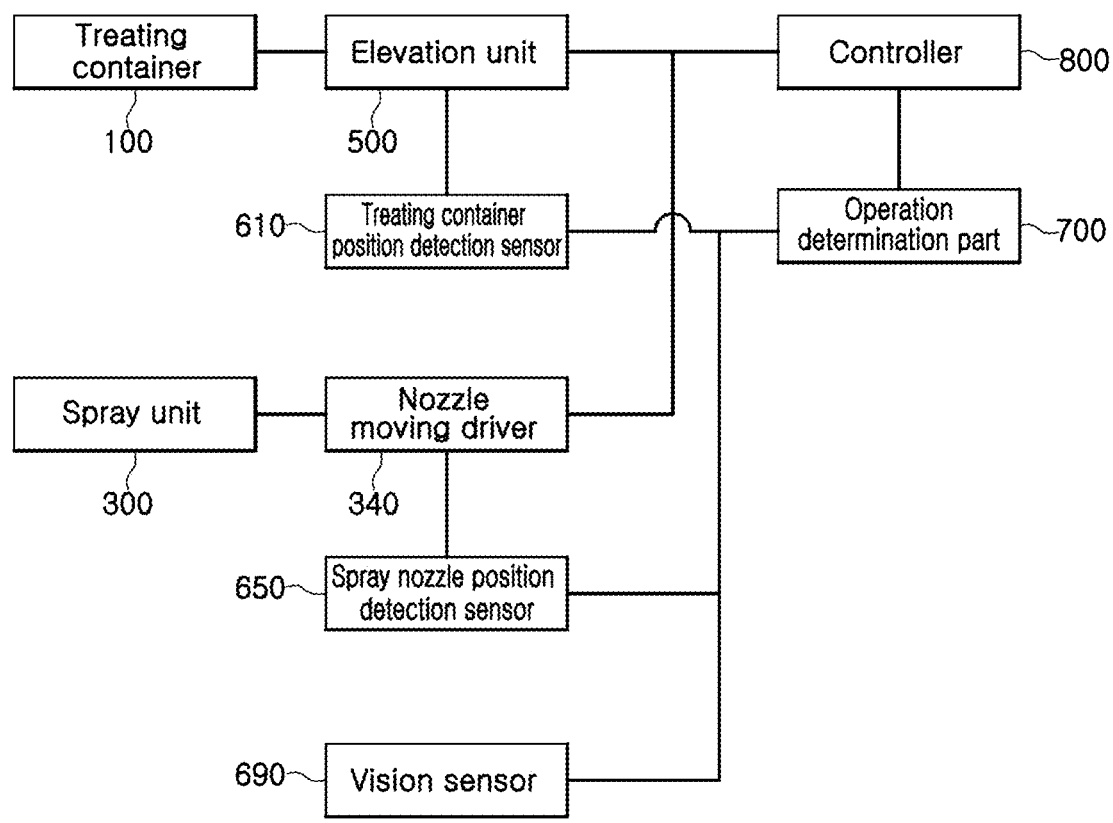
FIG. 3 is a block diagram showing main parts of the substrate treatment device according to an embodiment of the present disclosure.
Figure 4:
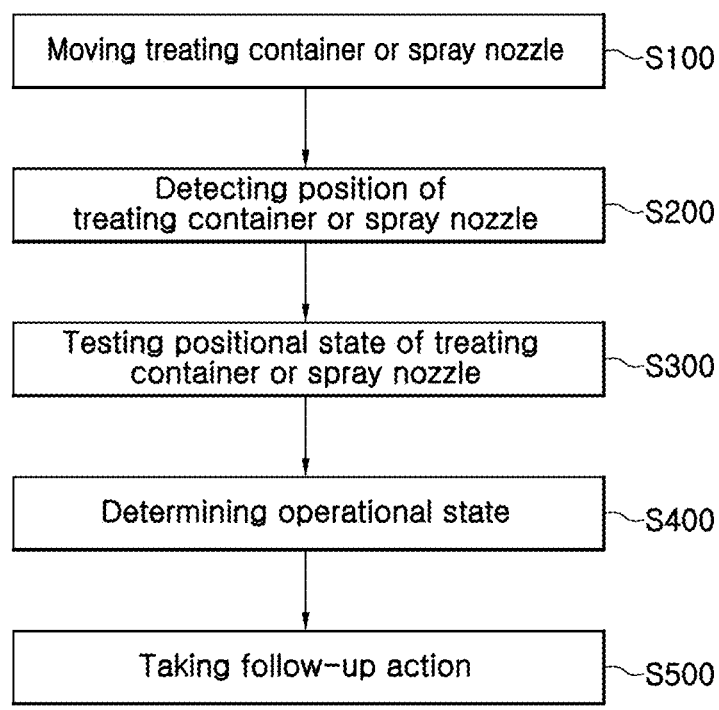
FIG. 4 is a flowchart showing a substrate treating method according to an embodiment of the present disclosure.

FIG. 1 is a view showing a substrate treatment device according to an embodiment of the present disclosure. FIG. 2 is a top view showing the substrate treatment device according to an embodiment of the present disclosure. FIG. 3 is a block diagram showing main parts of the substrate treatment device according to an embodiment of the present disclosure.

Referring to FIGS. 1 to 3, a substrate treatment device 10 includes a chamber 50, a treating container 100, a substrate support unit 200, a spray unit 300, a treating liquid supply device 400, elevation units 500, an operation determination part 700, a controller 800, etc.

The chamber 50 provides an airtight inner space. An air current 51 is provided at an upper portion of the chamber 50. The air current 51 may generate a downward air current in the chamber 50.

The air current 51 may filter high humidity outside air and supply the filtered air into the chamber 50. The high humidity outside air passes through the air current 51 and is supplied into the chamber and generates the downward air current. The downward air current provides a uniform air current to an upper portion of a substrate W. The downward air current discharges contaminants generated in a process of processing a surface of the substrate W by the treating fluid together with air through recovery containers 110, 120, and 130 of the treating container 100.

The chamber 50 may be divided into a process region 56 and a maintenance region 58. The treating container 100 and the substrate support unit 200 are located in the process region 56. A discharge line, an exhaust line, etc. connected to the treating container 100 are located in the maintenance region 58, and a drive part, a supply line, etc. connected to the spray unit 300 are located therein. In addition, a treating container moving driver 520a, 520b of the elevation units 500 is located while being extended from the maintenance region 58 to the process region 56. The maintenance region 58 is separated from the process region 56.

The treating container 100 may have a cylindrical shape with an open upper portion. The treating container 100 provides a process space for processing the substrate W. An open upper surface of the treating container 100 is provided as an insertion and removal passage of the substrate W. The substrate support unit 200 is located in the process space. When the process proceeds, the substrate support unit 200 rotates the substrate W while supporting the substrate W.

The treating container 100 provides a lower space in which an exhaust duct (not shown) is connected to a lower end of the treating container in order to perform forced exhaust. First to third recovery containers 110, 120, and 130, which introduce and suction treating liquid and gas flying from the surface of the substrate W rotated are arranged in multi-layers in the treating container 100. The ring-shaped first to third recovery containers 110, 120, and 130 may respectively include outlets communicating with a single common ring-shaped space.

Specifically, each of the first to third recovery containers 110, 120, and 130 includes a ring-shaped bottom surface and a cylindrical side wall extended from the bottom surface. The second recovery container 120 encloses the first recovery container 110 and is located while being spaced apart from the first recovery container 110. The third recovery container 130 encloses the second recovery container 120 and is located while being spaced apart from the second recovery container 120.

The first to third recovery containers 110, 120, and 130 provide first to third recovery spaces into which an air current including the treating liquid and fume flying from the substrate W is introduced. The first recovery space is defined by the first recovery container 110. The second recovery space is defined by a gap between the first recovery container and the second recovery container. The third recovery space is defined by a gap between the second recovery container and the third recovery container.

Each of the first to third recovery containers 110, 120, and 130 has an upper surface with an open center portion. Each of the first to third recovery containers 110, 120, and 130 has an inclination surface in which a distance between the bottom surface and the inclination surface is gradually increased from the side wall to an open center portion. The treating liquid flying from the substrate W is introduced into the recovery spaces along upper surfaces of the first to third recovery containers 110, 120, and 130 and is discharged to a used treating liquid or a treating liquid recycling unit.

Meanwhile, the treating container 100 is coupled to the elevation units 500 changing a vertical position of the treating container 100. The elevation units 500 linearly moves the treating container 100 in vertical directions. The elevation units 500 may be arranged at opposite sides of the treating container 100 or a plurality of elevation units 500 may be arranged along the circumference of the treating container 100 while being spaced apart from each other. As the treating container 100 is moved in the vertical directions by the elevation units 500, a relative height of the treating container 100 to the substrate support unit 200 is changed.

Each of the elevation units 500 includes a bracket 510a, 510b and a treating container moving driver 520a, 520b. The bracket 510a, 510b may be fixed to an outer wall of the treating container 100. The treating container moving driver 520a, 520b may include a rod cylinder vertically moving a shaft connected to the bracket 510a, 510b. When the substrate W is loaded or unloaded on a chuck stage 210, the treating container 100 is lowered so that the chuck stage 210 protrudes upward from the treating container 100. Furthermore, when the process proceeds, in order to introduce a treating liquid into a preset recovery container among the recovery containers 110, 120, and 130 in response to a type of the treating liquid supplied to the substrate W, the height of the treating container 100 is adjusted to correspond to the first to third recovery containers. With the height adjustment of the treating container 100, the treating container 100 may differentiate a type of treating liquid and a type of contaminant gas recovered for each of the first to third recovery spaces. Therefore, the elevation units 500 vertically move the treating container 100 to change a relative vertical position between the treating container 100 and the substrate support unit 200.

In order to adjust the height of the treating container 100 in accordance with the treating process, each of the elevation units 500 may include a treating container position detection sensor 610. The treating container position detection sensor 610 detects a height position of the treating container in response to vertical movements of the treating container 100.

The treating container position detection sensor 610 may include each treating container position detection sensor 610a, 610b while corresponding to the treating container moving driver 520a, 520b of each of the elevation units 500, thereby detecting a height position of the treating container 100. The treating container position detection sensor 610a, 610b includes a magnet and a magnet detection means (i.e., a magnet detector).

As an example, a magnet 620a, 620b is arranged at a lower end of the shaft of the treating container moving driver 520a, 520b, and a magnet detection means 630a, 630b is arranged to detect a position of the magnet 620a, 620b moved in response to the vertical movements of the shaft.

The magnet detection means 630a, 630b is arranged at the treating container moving driver 520a, 520b in each of the opposite sides of the treating container 100. Magnet detection means 631a, 632a, 633a, 631b, 632b, and 633b are arranged for each height preset to correspond to the height position of the treating container 100 for loading or unloading the substrate W on the chuck stage 210 and the height positions of the first to third multi-layered recovery containers 110, 120, and 130.

The arrangement position and the number of the magnet 620a, 620b and the arrangement position and the number of the magnet detection means 630a, 630b for detecting a moved position of the treating container 100 may be changed as necessary.

A vision sensor 690 is arranged above the treating container 100 to capture a position of the treating container 100 in response to the movement of the treating container 100.

The position detection of the treating container position detection sensor 610 with respect to the treating container 100 and the image of the moved position of the treating container 100 captured by the vision sensor 690 are provided to the operation determination part 700. The operation determination part 700 determines a positional state of the treating container 100.

As an example, In a situation where the detection result obtained by the treating container position detection sensor 610 is determined as an abnormal position, when the positional state of the treating container 100 in response to the positional state test result of the treating container 100 by the vision sensor 690 is a normal state, the operation determination part 700 determines that the detection result of the treating container position detection sensor 610 is a detection error, and when the positional state of the treating container 100 in response to the positional state test result of the treating container 100 by the vision sensor 690 is an abnormal state, the operation determination part 700 determines that the substrate treatment device 10 malfunctions.

Furthermore, in a situation where the detection result obtained by the treating container position detection sensor 610 is determined as a normal position, the operation determination part 700 calculates a detection tolerance of the treating container position detection sensor 610 and determines whether the detection tolerance exceeds a reference value on the basis of the positional state test result of the treating container 100 by the vision sensor 690.

The controller 800 controls the elevation units 500 to move the treating container 100 in the vertical directions, thus the relative height is changed. In addition, the controller 800 performs a follow-up action based on the operation determination result of the operation determination part 700.

When the operation determination result of the operation determination part 700 is a normal state, the controller 800 continuously performs the treating process of the substrate treatment device 10. When the operation determination result of the operation determination part 700 is an abnormal state, the controller 800 stops the treating process of the substrate treatment device 10. Furthermore, when the detection tolerance of the treating container position detection sensor 610 exceeds the reference value, the controller 800 stops the treating process of the substrate treatment device 10.

In addition, the controller 800 provides alarm information on the basis of the determination result of the operation determination part 700, and control automatic recovery to be performed when the treating process of the substrate treatment device 10 is stopped.

The substrate support unit 200 includes the chuck stage 210, which also serves as a spin head, a rotation shaft 220, a drive part 230, and a lower surface nozzle assembly 240.

The rotation shaft 220 connected to the spin head 210 is rotated by the drive part 230, thus the substrate W mounted on the spin head 210 is rotated. The lower surface nozzle assembly 240 in the rotation shaft 220 sprays the treating liquid on a rear surface of the substrate W. The spin head 210 has a support member provided for the substrate W to be supported while being spaced upward. The support member includes a plurality of chucking pins 211 and a plurality of support pins 222. The plurality of chucking pins 211 is provided to protrude from an edge portion of an upper surface of the spin head 210 while being spaced apart from each other at predetermined distances, and the plurality of support pins 222 is provided to protrude at portions inside the chucking pins 211. The rotation shaft 220 is connected to the spin head 210 and is formed in a hollow shaft with empty inside, and transmits a rotational force of the drive part 230, which will be described below, to the spin head 210.

The spray unit 300 includes a nozzle support 310, the spray nozzle 320, a support shaft 330, and a nozzle moving driver 340. The treating liquid supply device 400 supplies the treating fluid to the spray unit 300.

The spray nozzle 320 is provided at a lower surface of a first end of the nozzle support 310. A second end of the nozzle support 310 is connected to the nozzle moving driver 340 through the support shaft 330. The nozzle moving driver 340 rotates the nozzle support 310 on the second end of the nozzle support 310 to rotatably move the spray nozzle 320 to the process position and the waiting position. The process position is a position where the spray nozzle 320 is arranged vertically above the treating container 100. Preferably, the process position may be a position corresponding to a center portion of the substrate loaded on the substrate support unit 200. The waiting position is a position where the spray nozzle 320 is out of the vertically upper side of the treating container 100. The spray nozzle 320 supplies the treating fluid on the substrate W.

A spray nozzle position detection sensor 650 is arranged to detect the process position and the waiting position according to the rotational movement of the spray nozzle 320. The spray nozzle position detection sensor 650 includes a magnet and a magnet detection means.

As an example, at the nozzle support 310 including the spray nozzle 320 at a first end thereof, the magnet 660 is arranged at a second end of the nozzle support 310, and the magnet detection means 670 is arranged to detect a position of the magnet 660 according to the rotational movement of the nozzle support 310.

As the magnet detection means 670, a plurality of magnet detection means 670a and 670b is arranged for each rotating angle of the spray nozzle 320. For example, the magnet detection means 670b is arranged at a position corresponding to the waiting position of the spray nozzle 320 and the magnet detection means 670a is arranged at a position corresponding to the process position of the spray nozzle 320.

For detecting the position of the spray nozzle 320 the arranged position and the arranged number of magnets 660 and magnet detection means 670 for detecting the position of the spray nozzle 320 may be variously changed as necessary.

The vision sensor 690 is arranged above the spray nozzle 320 to capture the position of the spray nozzle 320. The vision sensor 690 is arranged to capture the position of the spray nozzle 320 while capturing the position of the treating container 100.

The detection of the position of the spray nozzle 320 performed by the spray nozzle position detection sensor 650 and the captured image of the moved position of the spray nozzle 320 obtained by the vision sensor 690 are supplied to the operation determination part 700. The operation determination part 700 determines the positional state of the spray nozzle 320.

As an example, In a situation where the detection result obtained by the spray nozzle position detection sensor 650 is determined as an abnormal position, when the positional state of the spray nozzle 320 in response to the positional state test result of the spray nozzle 320 by the vision sensor 690 is a normal state, the operation determination part 700 determines that the detection result of the spray nozzle position detection sensor 650 is a detection error, and when the positional state of the spray nozzle 320 in response to the positional state test result of the spray nozzle 320 by the vision sensor 690 is an abnormal state, the operation determination part 700 determines that the substrate treatment device 10 malfunctions.

Furthermore, in a situation where the detection result obtained by the spray nozzle position detection sensor 650 is determined as a normal position, the operation determination part 700 calculates a detection tolerance of the spray nozzle position detection sensor 650 and determines whether the detection tolerance exceeds a reference value on the basis of the positional state test result of the spray nozzle 320 by the vision sensor 690.

The controller 800 controls the nozzle moving driver 340 to rotate the spray nozzle 320, whereby the position of the spray nozzle 320 is changed. In addition, the controller 800 performs a follow-up action based on the operation determination result of the operation determination part 700.

When the operation determination result of the operation determination part 700 is a normal state, the controller 800 continuously performs the treating process of the substrate treatment device 10. When the operation determination result of the operation determination part 700 is an abnormal state, the controller 800 stops the treating process of the substrate treatment device 10. Furthermore, when the detection tolerance of the spray nozzle position detection sensor 650 exceeds the reference value, the controller 800 stops the treating process of the substrate treatment device 10.

In addition, the controller 800 provides alarm information on the basis of the determination result of the operation determination part 700, and control automatic recovery to be performed when the treating process of the substrate treatment device 10 is stopped.

According to the embodiment of the present disclosure, when the process of the substrate treatment device 10 is performed, an appropriate positional state of the treating container 100 or the spray nozzle 320 corresponding to the treating process is determined by detecting positional movement of the treating container 100 or the spray nozzle 320. Furthermore, a detection error of the plurality of position detection sensors and a malfunction of the substrate treatment device are determined so that a follow-up action may be performed.

A substrate treating method of the substrate treatment device according to the present disclosure is proposed in the present disclosure. Hereinbelow, the substrate treating method according to the present disclosure will be described with reference to an embodiment.

According to an embodiment of the present disclosure, the substrate treating method includes: moving the treating container 100 or the spray nozzle 320 to a preset position in response to the treating process of the substrate treatment device 10 at S100; detecting, by the plurality of position detection sensors 610 and 650, a moved position of the treating container 100 or the spray nozzle 320 at S200; vision-testing, by the vision sensor 690, a positional state of the treating container 100 of the spray nozzle 320 at S300; and determining an operation state, while integrating a detection result obtained by the plurality of position detection sensors 610 and 650 and a test obtained by the vision sensor 690, determining an error of the detection of the plurality of position detection sensors 610 and 650 or a malfunction of the substrate treatment device 10 at S400, and may further include: taking a follow-up action in response to a result of the determining the operational state at S500.

In the substrate treating method according to the present disclosure, the detecting by the plurality of position detection sensors at S200 or the taking the follow-up action at S500 will be described in detail with reference to a flowchart of the embodiment shown in FIG. 5.

The moved position of the treating container 100 or the spray nozzle 320 is detected by the treating container position detection sensor 610 or the spray nozzle position detection sensor 650 arranged for each preset position at S210 to determine whether the treating container 100 or the spray nozzle 320 is moved to a normal position at S230.

Furthermore, the moved position of the treating container 100 or the spray nozzle 320 is captured by the vision sensor 690 from an upper side of the treating container 100 or the spray nozzle 320 at S310, and a positional state of the treating container 100 or the spray nozzle 320 is tested at S330. The testing the positional state at S330 is performed such that the operation determination part 700 pre-stores normal state information of the treating container 100 or the spray nozzle 320 for each position and the image obtained by capturing the moved position of the treating container 100 or the spray nozzle 320 is compared to the normal state information for each position to test whether the positional state of the treating container 100 or the spray nozzle 320 is the normal state.

For example, a normal state image of the treating container 100 or the spray nozzle 320 at a predetermined position is pre-stored. Then, the normal state image is compared to the captured image to test a positional state whether the treating container 100 or the spray nozzle 320 is precisely moved to the position or a predetermined portion thereof is dislocated or misaligned.

As an example, when the detection result obtained by the treating container position detection sensor 610 or the spray nozzle position detection sensor 650 is determined as an abnormal position at S230, the operation determination part 700 determines whether the positional state of the treating container 100 or the spray nozzle 320 due to an error in the detection of the treating container position detection sensor 610 or the spray nozzle position detection sensor 650 or a malfunction of the substrate treatment device 10 is the normal state on the basis of the result of the positional state test performed by the vision sensor 690 at S450.

For example, when the positional state of the treating container 100 or the spray nozzle 320 is determined as the normal state at S450, the operation determination part 700 determines an operational state of the treating container position detection sensor 610 or the spray nozzle position detection sensor 650 at S550. When the detection result obtained by the treating container position detection sensor 610 or the spray nozzle position detection sensor 650 is the abnormal position even though the positional state test result obtained by the vision sensor 690 is the normal state, the operation determination part 700 determines that the detection result is the detection error of the treating container position detection sensor 610 or the spray nozzle position detection sensor 650

Furthermore, when the positional state of the treating container 100 or the spray nozzle 320 is determined as the abnormal state at S450, the operation determination part 700 determines that the detection result is a malfunction of the substrate treatment device 10. With the test result of the positional state by the vision sensor 690, whether the treating container moving driver 520a, 520b, the nozzle support 310, or the nozzle moving driver 340 malfunctions may be determined.

Then, on the basis of the positional state test result obtained by the operation determination part 700, the controller 800 controls the substrate treatment device 10. When the detection result obtained by the treating container position detection sensor 610 or the spray nozzle position detection sensor 650 is determined as the detection error, the controller 800 continuously proceeds the treating process of the substrate treatment device 10 at S570. When the detection result obtained by the treating container position detection sensor 610 or the spray nozzle position detection sensor 650 is determined as a malfunction of the substrate treatment device 10, the controller 800 stops the treating process of the substrate treatment device 10 at S520.

The controller 800 may provide information about the positional state test result in addition to the alarm information to an administrator when the treating process of the substrate treatment device 10 is stopped. In addition, the controller 800 may perform automatic recovery with respect to a portion where the malfunction of the substrate treatment device 10 occurs, at S530. The automatic recovery may be performed by resetting the entire process of the substrate treatment device 10 or the portion with the malfunction of the substrate treatment device 10.

Moreover, the controller 800 determines whether the treating container position detection sensor 610 or the spray nozzle position detection sensor 650 is broken, on the basis of the number of detection error occurrence of the treating container position detection sensor 610 or the spray nozzle position detection sensor 650 and may supply the breakdown information to the administrator.

As an example, when the detection result obtained by the treating container position detection sensor 610 or the spray nozzle position detection sensor 650 is determined as the normal position, the operation determination part 700 calculates a positional deviation generated due to the dislocation or misalignment of the treating container 100 or the spray nozzle 320 on the basis of the positional state test result by the vision sensor 690 at S410. Based on determination that the calculated positional deviation exceeds a reference value at S430, the operation determination part 700 calculates the detection tolerance of the treating container position detection sensor 610 or the spray nozzle position detection sensor 650.

The detection tolerance of the treating container position detection sensor 610 or the spray nozzle position detection sensor 650 may be calculated such that a positional deviation with respect to a degree of the dislocation or the misalignment of a specific portion of the treating container 100 or the spray nozzle 320 is calculated by comparing the normal state image to the captured image at the specific position, and the positional deviation and the reference value are compared to each other.

Based on the operational state determination result of the operation determination part 700, the controller 800 controls the substrate treatment device 10. When the operation determination part 700 determines that the positional deviation of the treating container 100 or the spray nozzle 320 is within the reference value, the controller 800 continuously proceeds the treating process of the substrate treatment device 10 at S570 while handling the detection tolerance of the treating container position detection sensor 610 or the spray nozzle position detection sensor 650 within an allowable range. When the operation determination part 700 determines that the positional deviation of the treating container 100 or the spray nozzle 320 exceeds the reference value, the operational state of the treating container position detection sensor 610 or the spray nozzle position detection sensor 650 is determined as a breakdown at S510, and the controller 800 stops the treating process of the substrate treatment device 10.

In addition, in the stop of the treating process of the substrate treatment device 10, the controller 800 may provide the information about the breakdown of the detection tolerance of the treating container position detection sensor 610 or the spray nozzle position detection sensor 650 to the administrator in addition to the alarm information.

Hereinbelow, the substrate treating method according to the present disclosure will be described in detail with reference to an embodiment about movement of the treating container 100 or the spray nozzle 320.

Figure 6A:
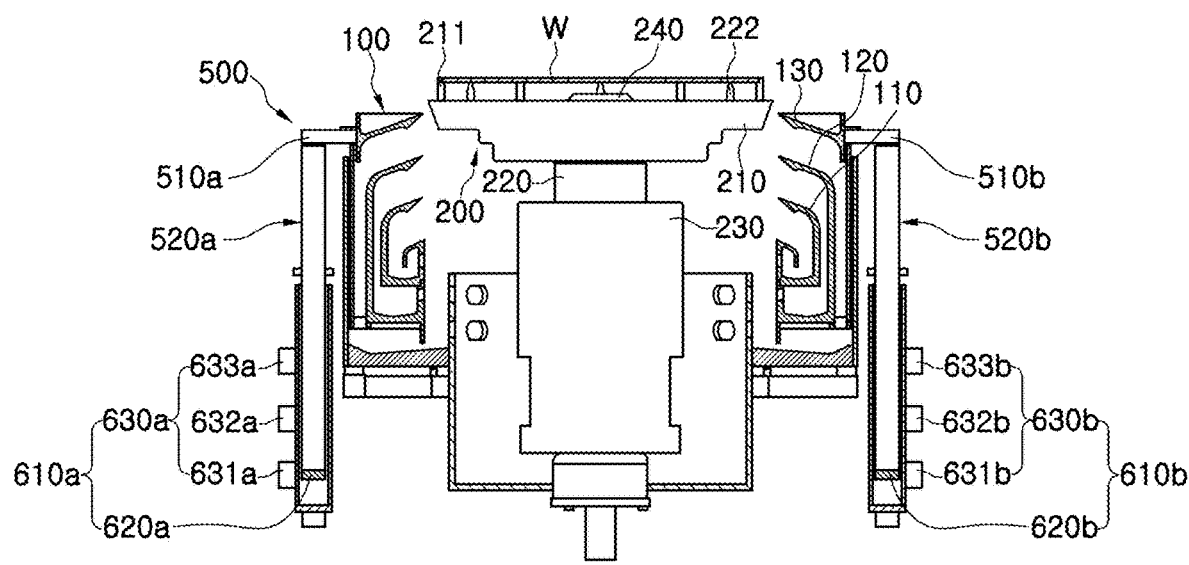
FIGS. 6A and 6B are view showing an operation of detecting height position in response to relatively vertical movement of a treating container according to an embodiment of the present disclosure.
Figure 6B:
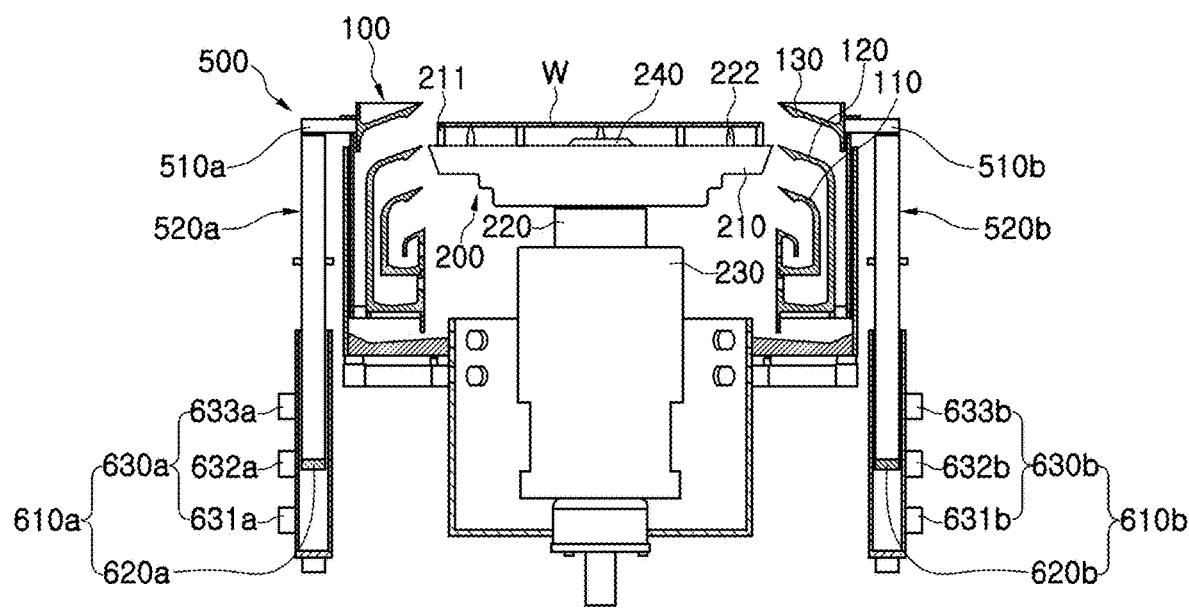

FIGS. 6A and 6B are view showing an embodiment detecting the moved position of the treating container 100 according to the present disclosure.

FIG. 6A shows a position of the treating container 100 in loading or unloading of the substrate W, the treating container 100 is moved upward to the preset position by the treating container moving driver 520a, 520b arranged at each of the opposite portions of the treating container 100. When the treating container 100 is moved downward to the preset position in order to load or unload the substrate W, a position of the magnet 620a, 620b arranged at a lower end of the shaft is detected by one of the plurality of magnet detection means 630a, 630⊙ corresponding to the loading or unloading of the substrate W.

Furthermore, when the treating container 100 is moved upward to a related position in order to introduce and suction the treating fluid, the treating container moving driver 520a, 520b arranged at each of the opposite portions of the treating container 100 moves the treating container 100 upward to the preset position.

As shown in FIG. 6B, when the treating container 100 is moved upward to the preset position in order to introduce and suction the treating fluid into the third recovery container 130, the position of the magnet 620a, 620b at the lower end of the shaft may be detected by one of the plurality of magnet detection means 630a, 630b corresponding to the position for introducing and suctioning the treating liquid into the third recovery container 130.

As described above, when the treating container 100 is moved to the preset position, the position of the treating container is detected by the treating container position detection sensor 610.

According to the present disclosure, whether the detection error of the treating container position detection sensor 610 or the malfunction of the substrate treatment device 10 occurs is determined by integrating the detection result obtained by the treating container position detection sensor 610 and the test result obtained by the vision sensor 690, which will be described with reference to FIGS. 7A to 8B.

Figure 7A:
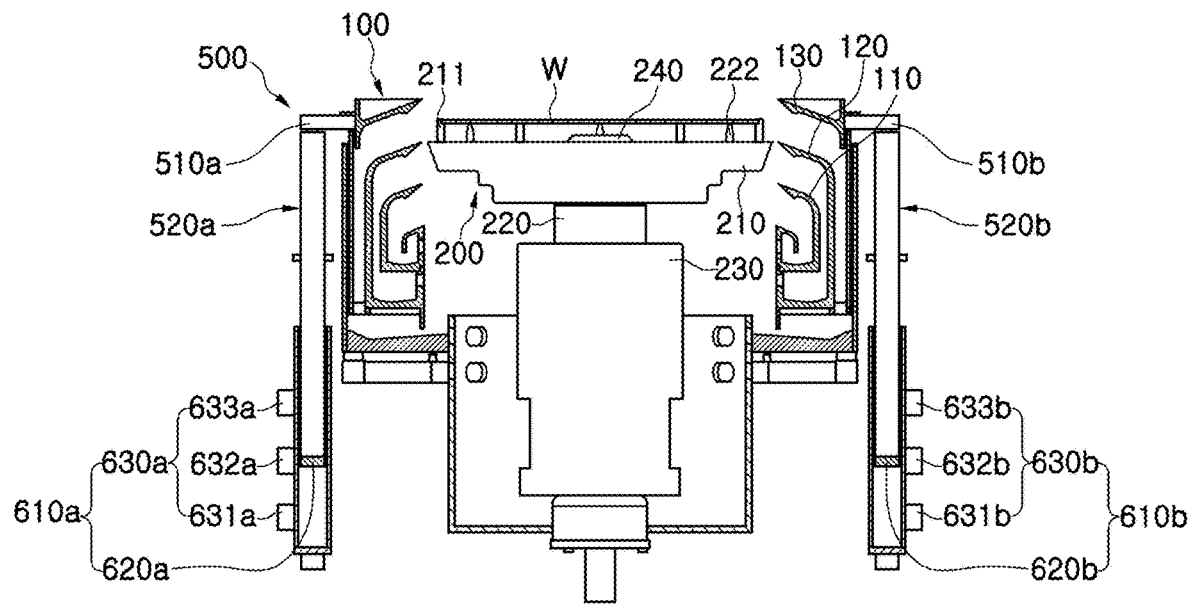
FIGS. 7A and 7B are views showing detecting and testing the height position of the treating container according to an embodiment of the present disclosure.

As shown in FIG. 7A, when the treating container 100 is moved upward in order to introduce and suction the treating fluid into the third recovery container 130, the position of the magnet 620a, 620b at the lower end of the shaft is detected by one of the plurality of magnet detection means 630a, 630b corresponding to the position for introducing and suctioning the treating fluid into the third recovery container 130.

Figure 7B:
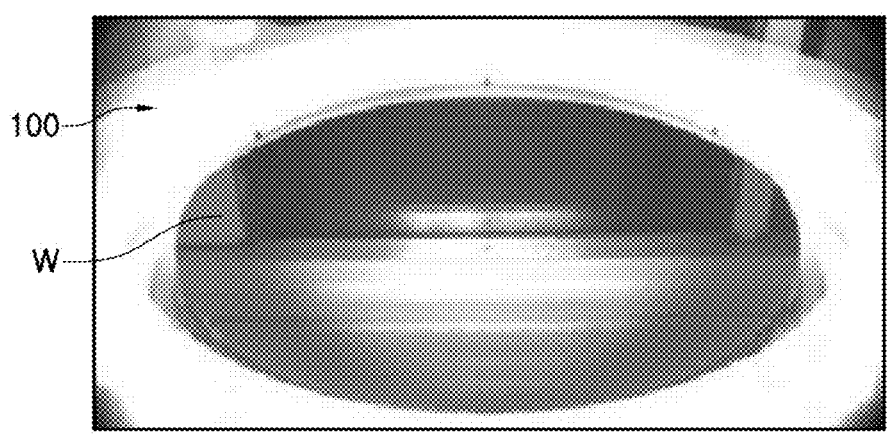

As shown in FIG. 7B, in order to introduce and suction the treating fluid into the third recovery container 130, the vision sensor 690 captures the positional state of the treating container 100 and tests the positional state by comparing the captured image to the pre-stored normal state information.

As an example, in a situation where the treating container position detection sensor 610 detects the position of the treating container 100 as the abnormal position even though the treating container 100 is moved to the normal position in order to introduce and suction the processing fluid into the third recovery container 130 as shown in FIG. 7A, when the positional state of the treating container 100 is determined as the normal state by testing the positional state of the treating container 100 by the vision sensor 690 as shown in FIG. 7B, the detection result is determined as the detection error the treating container position detection sensor 610 and the treating process is continuously performed.

Figure 8A:
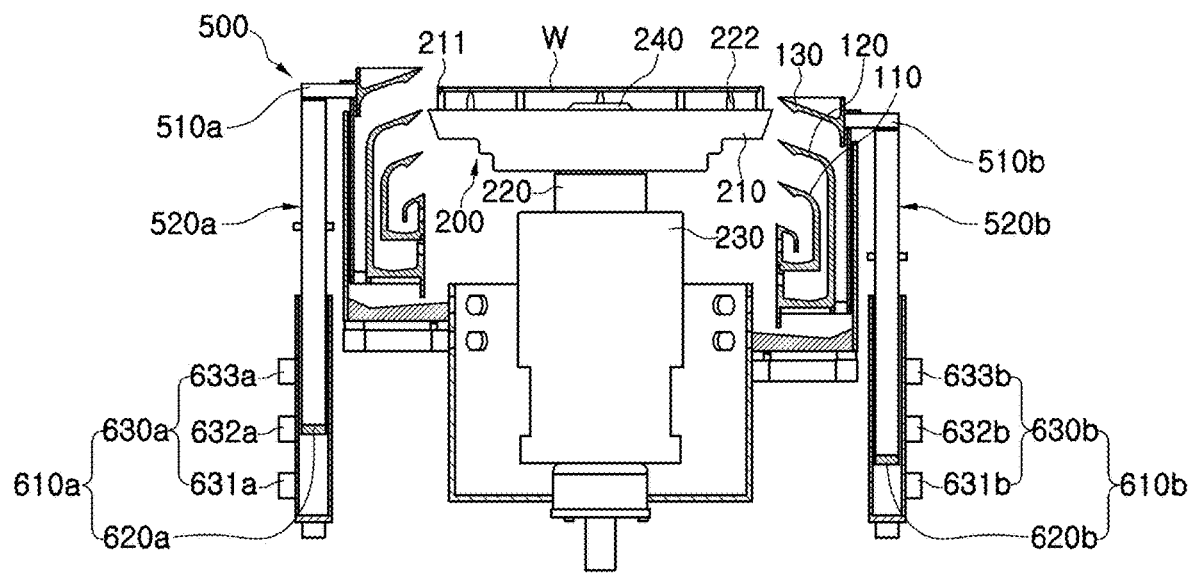
FIGS. 8A and 8B are views showing detecting and testing the height position of the treating container according to another embodiment of the present disclosure.
Figure 8B:
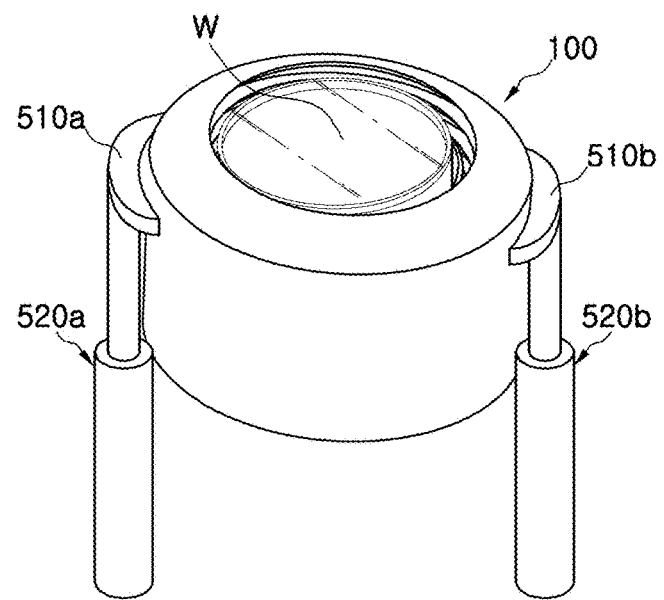

As another example, as shown in FIG. 8A, the treating container 100 is moved upward in order to introduce and suction the processing fluid into the third recovery container 130, as a treating container moving driver 510a among the treating container moving drivers 520a and 520b arranged at one of the opposite sides of the treating container 100 is normally operated, but a treating container moving driver 520b is not normally operated, when a treating container position detection sensor 610b arranged at the treating container moving driver 520b not normally operated detects the position of the treating container 100 as the normal position even though the treating container 100 is dislocated and is not moved to the normal position as shown in FIG. 8B, a malfunction of the treating container moving driver 520b may be determined by testing the positional state of the treating container 100 by the vision sensor 690.

Furthermore, in the present disclosure, it is determined whether the detection error of the spray nozzle position detection sensor 650 or the malfunction of the substrate treatment device 10 occurs by integrating the detection result obtained by the spray nozzle position detection sensor 650 and the test result obtained by the vision sensor 690, which will be described with reference to FIGS. 9A to 10.

While the spray nozzle 320 is in the waiting position, the nozzle moving driver 340 rotates the nozzle support 310 to which the spray nozzle 320 is arranged so that the spray nozzle 320 is rotatably moved to the process position. The magnet detection means 670a, 670b arranged for each rotary angle detects the movement of the magnet 660 arranged in the nozzle support 310 to detect the rotary movement of the spray nozzle 320.

Figure 9A:
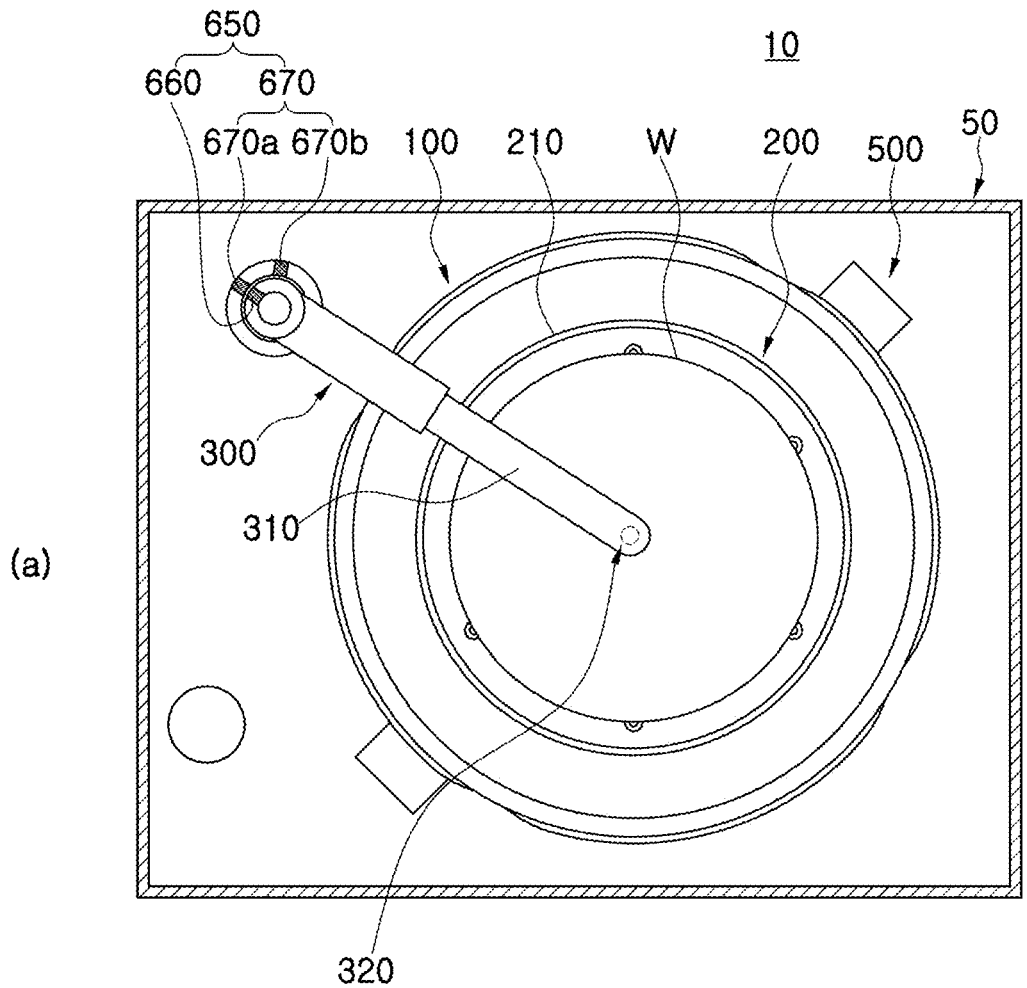
FIGS. 9A and 9B are views showing detecting and testing a rotated position of a spray nozzle according to an embodiment of the present disclosure.

As shown in FIG. 9A, when the spray nozzle 320 is moved from the waiting position to the normal position of the process position, the magnet detection means 670a detects the magnet 660 arranged at the nozzle support 310.

Figure 9B:
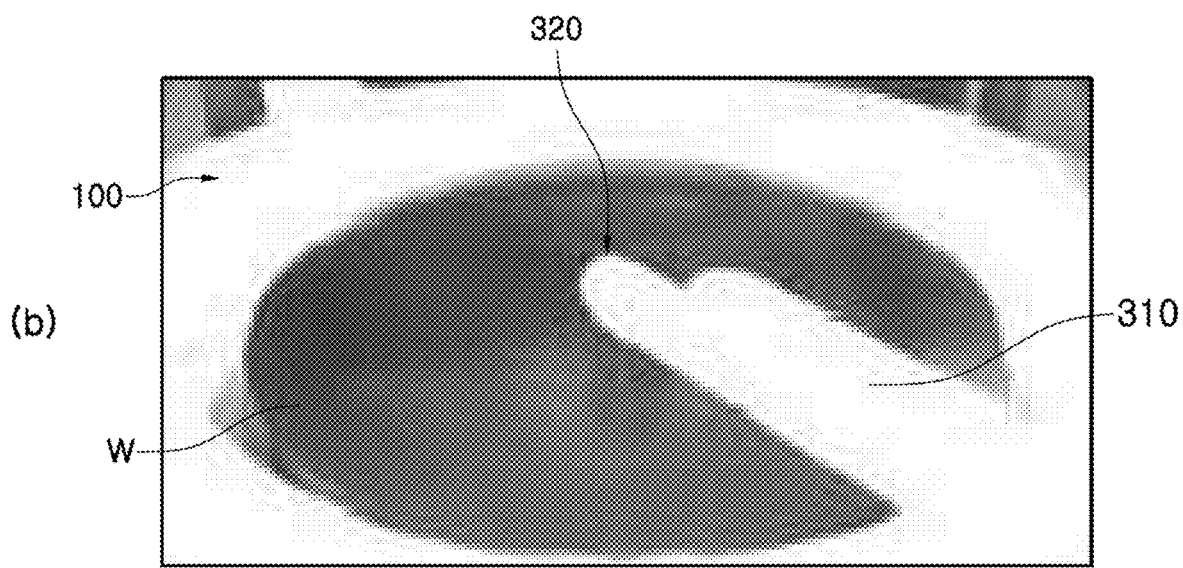

As shown in FIG. 9B, the vision sensor 690 captures the positional state of the spray nozzle 320 and tests the captured image by comparing the captured image to the pre-stored normal state information.

As an example, as shown in FIG. 9A, in a situation where the spray nozzle position detection sensor 650 detects the position of the spray nozzle as the abnormal position even though the spray nozzle 320 is moved to the normal process position, when the vision sensor 690 tests the positional state of the spray nozzle 320 and the positional state thereof is determined as the normal state as shown in FIG. 9B, the detection result is determined as the detection error of the spray nozzle position detection sensor 650 and the treating process is continuously performed.

Figure 10:
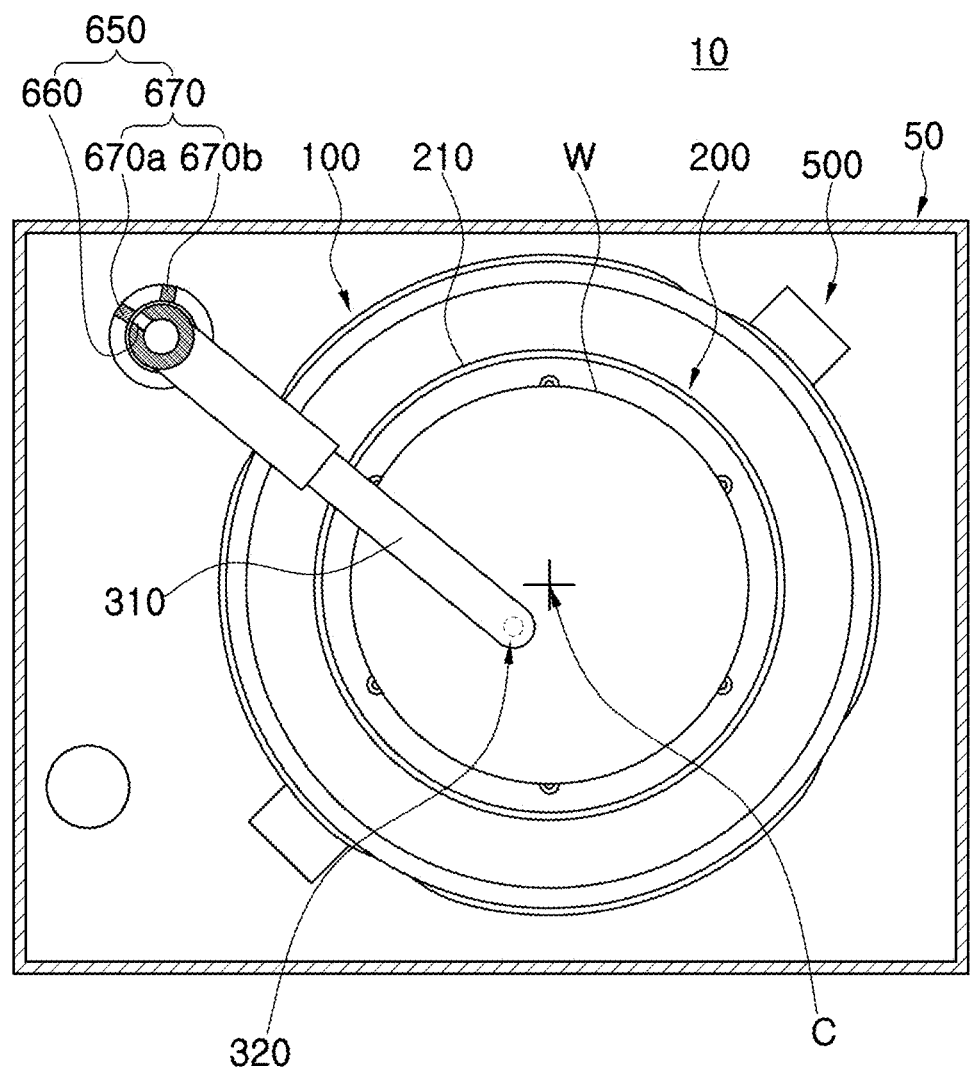
FIG. 10 is view showing detecting and testing the rotated position of the spray nozzle according to another embodiment of the present disclosure.

As another example, as shown in FIG. 10, when the spray nozzle position detection sensor 650 detects the position of the spray nozzle as the normal position even though the spray nozzle 320 is not moved to the normal position corresponding to the process position C as the nozzle moving driver 340 is not normally operated, the vision sensor 690 tests the positional state of the spray nozzle 320 so that the malfunction of the nozzle moving driver 340 may be determined.

As described above, according to the present disclosure, while the positional state of the treating container or the spray nozzle is detected by the plurality of position detection sensors and additionally tested by the vision sensor, the detection error of the plurality of position detection sensors can be determined. Therefore, it is possible to prevent the treating process of the substrate treatment device from being unnecessarily stopped and a process yield can be improved.

When the plurality of position detection sensors detects a position of the processing container or the spray nozzle as the normal position even though the treating container or the spray nozzle failed to move to the normal position, the position thereof can be determined as the abnormal position by the vision sensor can, and serious problems such as defective products or equipment damage by performing the treating process can be prevented in advance.

Although the embodiments of the present disclosure have been disclosed for illustrative purposes, those skilled in the art will appreciate that various modifications, additions and substitutions are possible, without departing from the scope and spirit of the invention as disclosed in the accompanying claims. Therefore, the embodiments disclosed in the present disclosure are not provided to describe the technical sprit of the present disclosure, not limit it, and the technical sprit of the present disclosure is not limited by the embodiments described above. The patent right of the present disclosure is interpreted by the accompanying claims, and it should be interpreted that the present disclosure includes various modifications, additions and substitutions without departing from the scope and spirit of the invention.

What is claimed is:

1. A substrate treating method comprising:
    moving a first component of a substrate treatment device to a preset position in response to a treating process of the substrate treatment device;
    detecting, by a plurality of position detection sensors, a position of the first component, wherein each of the plurality of position detection sensors includes a corresponding one of a plurality of magnetic detectors;
    determining whether the first component is positioned at an abnormal position based on a result of the detecting of the position of the first component to generate a first result;

first vision-testing, by a vision sensor, a positional state of the first component; and determining, after the determining that the first component is positioned at the abnormal position, whether the first component is position at a normal state based on a result of the vision-testing of the positional state of the first component to generate a second result; and determining one of whether to stop the treating process of the process and whether to operate the treating process of the substrate based on the first and second results, taking a follow-up action in response to the determining of whether to stop the treating process of the process or operate the treating process of the substrate based on the first and second results; stopping an operation of the substrate treatment device when the first result is determined as an abnormal position and the second result is determined as an abnormal state; proceeding the treating process of the substrate device having the first component which is moved to the preset position when the first result is determined as an abnormal position and the second result is determined as a normal state.

2. The substrate treating method of claim 1, wherein the detecting by the plurality of position detection sensors is performed by detecting the position of the first component by the plurality of position detection sensors arranged for the preset position, and wherein the vision-testing is performed by comparing pre-stored normal state information for the preset position to an image of the first component captured by the vision sensor and determining the positional state of the first component.

3. The substrate treating method of claim 2, wherein the first component is a treating container, wherein the detecting by the plurality of position detection sensors is performed by detecting a magnet provided at each of a plurality of elevation units located at opposite sides of the treating container by the plurality of magnet detectors arranged at a plurality of heights of the treating container, respectively, and wherein the vision-testing is performed by comparing a captured image taken from an upper side of the treating container to pre-stored normal state information for the preset position of the treating container and detecting a positional state of the treating container.

4. The substrate treating method of claim 2, wherein the first component is a spray nozzle, wherein the detecting by the plurality of position detection sensors is performed by detecting a magnet arranged at a second portion of a nozzle support with the spray nozzle, the spray nozzle being arranged at a first portion of the nozzle support, by the plurality of magnet detectors arranged at a plurality of rotated positions of the spray nozzle, respectively, and wherein the vision-testing is performed by comparing a captured image taken from an upper side of the spray nozzle to pre-stored normal state information for the preset position of the spray nozzle to detect a positional state of the spray nozzle.

5. The substrate treating method of claim 1, wherein the taking the follow-up action is performed by providing error-in-detection information of the plurality of position detection sensors on the basis of a number of detection error occurrences of the plurality of position detection sensors.

6. The substrate treating method of claim 1, further comprising:

second vision-testing, by the vision sensor, after the determining that the first component is NOT positioned at the abnormal position, a positional state of the first component calculating a positional deviation of the first component when the first result is determined as a normal position based on the positional state of the first component obtained by the second vision-testing; and determining whether the calculated positional deviation exceeds a reference value; and stopping the treating process of the substrate when the calculated positional deviation is determined as exceeding the reference value.

7. The substrate treating method of claim 6, further comprising:

providing alarm information about the stopping of the treating process of the substrate treatment device and performing automatic recovery on the substrate treatment device.

8. A substrate treating method comprising:

moving a treating container to a preset position in response to a treating process of a substrate treatment device;

detecting, by a plurality of magnet detectors arranged at a plurality of height positions of the treating container, respectively, a plurality of magnets provided at a plurality of elevation units, respectively, located at opposite sides of the treating container;

determining whether the treating container is positioned at an abnormal position based on a result of the detecting of a position of the treating container to generate a first result;

vision-testing a positional state of the treating container by comparing an image captured from an upper side of the treating container via a vision sensor to pre-stored normal state information for the preset position of the treating container;

determining, after the determining that the treating container is positioned at the abnormal position, whether the treating container is position at a normal state based on a result of the vision-testing of the positional state of the treating container to generate a second result;

determining one of whether to stop the treating process of the substrate and whether to operate the treating process of the substrate based on the first and second results, taking a follow-up action in response to the determining of whether to stop the treating process of the process or operate the treating process of the substrate based on the first and second results; stopping an operation of the substrate treatment device when the first result is determined as an abnormal position and the second result is determined as an abnormal state; proceeding the treating process of the substrate device having the first component which is moved to the preset position when the first result is determined as an abnormal position and the second result is determined as a normal state.

* * * * *